(12) United States Patent  
Tseng

(10) Patent No.: US 7,109,759 B2  
(45) Date of Patent: Sep. 19, 2006

(54) VOLTAGE MODE CURRENT-ASSISTED PRE-EMPHASIS DRIVER

(75) Inventor: Pei-Der Tseng, Cupertino, CA (US)

(73) Assignee: Avago Technologies Fiber IP (Singapore) Pte.Ltd., Singapore (SG)

( * ) Notice: Subject to any disclaimer, the term of this patent is extended or adjusted under 35 U.S.C. 154(b) by 508 days.

(21) Appl. No.: 10/445,167

(22) Filed: May 23, 2003

(65) Prior Publication Data

US 2004/0246613 A1    Dec. 9, 2004

(51) Int. Cl.
*H03K 19/094* (2006.01)

(52) U.S. Cl. .......................... 326/115; 326/83; 327/108

(58) Field of Classification Search ................. 326/83, 326/86, 87, 115, 108, 112, 119; 327/108
See application file for complete search history.

(56) References Cited

U.S. PATENT DOCUMENTS

| | | | |
|---|---|---|---|
| 6,292,014 B1 | 9/2001 | Hedberg | |
| 6,373,346 B1 | 4/2002 | Kobayashi | |
| 6,437,599 B1 | 8/2002 | Groen | |
| 6,445,530 B1 | 9/2002 | Baker | |
| 6,940,302 B1* | 9/2005 | Shumarayev et al. | 326/26 |

FOREIGN PATENT DOCUMENTS

| | | |
|---|---|---|
| EP | 1189399 A2 | 3/2002 |
| EP | 1282233 A1 | 2/2003 |

OTHER PUBLICATIONS

"Development of the high-band 8mm video system," by Tsuneki, K.; Ezaki, T.; Hirai, J.; Kubota, Y., IEEE Transactions on Consumer Eloectronics, vol. 35, Issue:3, pp. 436 to 441, Aug. 1989.

"A Low-Power 8-PAM Serial Transceiver in 0.5-um Digital CMOS," by Foley, David J.; Flynn, Michael P., IEEE Journal of Solid-State Circuits, vol. 37, No. 3, pp. 310 to 316, Mar. 2002.

"A 0.4-um CMOS 10 Gb/s 4-PAM Pre-emphasis Serial Link Transmitter, " by Farjad-Rad, Ramin; Yang, Chih-Kong Ken; Horowitz, Mark A.; Lee, Thomas H., IEEE Journal of Solid-State Circuits, vol. 34, No. 5, pp. 580 to 585, May 1999.

* cited by examiner

*Primary Examiner*—Daniel Chang

(57) ABSTRACT

Driver circuit that generates a drive waveform with a static bit swing and a pre-emphasis bit swing. The driver circuit includes an input (IN) node, a complementary input (INB) node, an output (OUT) node and a complementary output (OUTB) node. The driver circuit includes a fundamental swing determination mechanism (FSDM) that is coupled to the output (OUT) node and a complementary output (OUTB) node. The fundamental swing determination mechanism (FSDM) determines or sets the fundamental swing of the drive waveform by generating a fundamental current. The fundamental swing determination mechanism (FSDM) includes at least one switched resistor circuit. The driver circuit also includes a modulation swing determination mechanism (MSDM) that is coupled to the output (OUT) node and a complementary output (OUTB) node. The modulation swing determination mechanism (MSDM) determines or sets the modulation swing of the drive waveform by generating a modulation current. The modulation swing determination mechanism (MSDM) includes at least one switched current source. The pre-emphasis bit swing of the drive waveform is generated when the modulation current is added to the fundamental current. The static bit swing is generated when the modulation current is subtracted from the fundamental current.

20 Claims, 10 Drawing Sheets

VOLTAGE MODE CURRENT-ASSISTED PRE-EMPHASIS DRIVER

FIELD OF THE INVENTION

The present invention relates generally to signal shaping circuits, and more particularly, to a voltage mode current-assisted pre-emphasis driver.

BACKGROUND OF THE INVENTION

Interface circuits are important for converting signals between systems that have different signal requirements (e.g., a first integrated circuit that has a first set of signal requirements and a second integrated circuit that has a second set of signal requirements). These interface circuits can be incorporated in the first IC as a last output stage, in the second IC as a first input stage, or as a stand-alone circuit that is interposed between the first IC and the second IC.

One trend in electronic systems is the reduction in the power supply voltage (e.g., Vcc). These systems that operate with lower power supply voltages are especially conducive for low-power consumption applications (e.g., portable electronic devices) since a lower power supply voltage leads to lower power consumption. However, as the supply voltage in systems is reduced, it becomes more of a challenge to meet certain electrical specifications. For example, certain requirements, such as voltage swing and common mode voltage, are increasing difficult to meet especially as the supply voltage for electronic systems decreases.

One example, of a specification with strict electrical requirements is the InfiniBand™ Architecture Specification. InfiniBand Trade Association publishes InfiniBand™ Architecture Specification Release 1.1, Vol. 1 and Vol. 2 (released Nov. 6, 2002) (see http://www.infinibandta.org/specs/register/publicspec/). This specification sets forth various parameters and requirements for the electrical, optical, mechanical specifications for use by designers of products and components that are compliant with the InfiniBand™ Architecture.

Specifically, as the power supply voltage decreases, there are certain design parameters that may become more difficult to meet. For example, one parameter related to the differential output is the common mode voltage (VCM). Commonly used CML drivers, which are described in greater detail hereinafter, have good power supply noise rejection, but usually have a higher output VCM, which is sometimes constrained by the electrical requirements or specifications of a system.

The InfiniBand Architecture Release 1.1, for example, specifies common mode voltage (VCM) with a maximum of 1.0V and a minimum of 0.5V. The common mode voltage (VCM) is determined by the expression: (Vhigh+V low)/2. Another parameter related to the differential output is the differential output (Vdiff). The InfiniBand Architecture Release 1.1, for example, specifies a Vdiff with a maximum of 1.6V and a minimum of 1.0V. The Vdiff is the peak-to-peak differential voltage with a 100 ohm differential load. On the other hand, voltage mode H-bridge drivers can have a relatively lower VCM, which is generally set by Vcc/2.

Many modern high speed communication systems require a single-ended output impedance of 50 ohms for the driver and the load differential impedance across the output nodes of 100 ohms. Under these conditions, the maximum differential output swing is limited or restricted to the voltage supply magnitude (Vcc) (that is, a single-ended swing of Vcc/2). It would be desirable to remove this voltage swing limitation or increase the voltage headroom with respect to the minimum voltage swing.

Interface circuits typically employ a wave-shaping or conditioning circuit to generate an output waveform to drive the next stage with signals that conform to the requirements of the next stage (e.g., a system compliant with the InfiniBand™ Architecture Specification). A driver circuit is typically designed for generating the drive waveform.

As can be appreciated, selecting a driver architecture is an important aspect of designing the wave shaping or conditioning circuit. Some of the different approaches to designing a driver circuit are now described.

There are two primary driver architectures. The first driver architecture is a current mode driver (also referred to as a CML driver). In CML drivers, current sources are defined, and the output swing is determined by a current proportional to the defined current source flowing through a load resistance.

The second driver architecture is a voltage mode driver. Unlike the CML driver, the voltage mode driver does not have current sources. Instead, the voltage mode driver determines the output swing by the switching behavior of transistors employed in the driver.

Between these two driver architectures, voltage mode drivers (see the following example) have a lower power consumption and a lower common mode voltage (VCM) as compared to current mode drivers when provided with the same operating voltage supply (Vcc) and output voltage swing (Vdiff). Power consumption is generally measures by the expression V*I, where V represents the power supply voltage (e.g., Vcc) and I represents the power supply current.

In this regard, the voltage mode driver architecture may be preferred to meet the requirements of some standards, such as InfiniBand Architecture.

One example of a voltage mode driver design is described in U.S. Pat. No. 6,445,530 entitled, "Class AB H-bridge using current sensing MOSFETs" (Inventor: John M. Baker). U.S. Pat. No. 6,445,530 is directed to the use of H-bridges to create different current flowing through an output load. Unfortunately, one disadvantage of this approach is that when applied to a modern high-speed communication systems with a 50-ohm output impedance and a 100-ohm differential load impedance, the maximum output swing is limited to the supply voltage as mentioned earlier, which can be a challenge when designing with strict requirements for power consumption and output high voltage.

Examples of driver architectures that employ a current mode logic (CML) are now described. One example of a CML driver is described in U.S. Pat. No. 6,437,599 entitled, "Programmable Line Driver" (Inventor: Eric Groen). This approach employs two differential pairs with programmable bias current to pre-emphasize the output signal.

A second example of a CML driver is described in U.S. Pat. No. 6,373,346, entitled, "Laser Driver pre-emphasis and de-emphasis method and/or architecture with tuning and duty cycle control" (Inventor: Kevine Wesley Kobayashi). This approach employs two additional control circuits of differential pairs to pre-distort the output signal generated by the main differential driver.

A third example of a CML driver is described in a paper entitled, "A 0.4-um CMOS 10 Gb/s 4-PAM Pre-emphasis Serial Link Transmitter," by Farjad-Rad, Ramin; Yang, Chih-Kong Ken; Horowitz, Mark A.; Lee, Thomas H., IEEE Journal of Solid-State Circuits, Volume: 34, No. 5, May 1999, pages 580 to 585. This approach employs drivers in combination with FIR filters to generate a pre-emphasis signal. One disadvantage of this approach is that for certain applications (e.g., low common mode applications) where voltage headroom is needed, this type of driver is difficult to implement, especially with a low voltage supply and large voltage swing.

One significant drawback of the CML driver architecture is that the CML driver consumes more power than its voltage mode counterpart (i.e., a voltage mode driver architecture).

Another approach to driver design employs passive components for pre-emphasis. An example of this approach is described in a paper entitled, "Development of the high-band 8 mm video system," by Tsuneki, K.; Ezaki, T.; Hirai, J.; Kubota, Y., IEEE Transactions on Consumer Electronics, Volume: 35, Issue 3, pages 436 to 441, August 1989. One disadvantage of this approach is that if this technique is utilized in the design of a driver integrated circuit (IC), excessively large capacitance will be required to provide sufficient bandwidth for high speed application. As can be appreciated, it may be difficult and problematic to integrate large capacitances in integrated circuits.

Another approach is driver design employs DAC controlled current sources to add/subtract with a main current source to generate a pre-emphasis signal. An example of this approach is described in a paper entitled, "A Low-Power 8-PAM Serial Transceiver in 0.5-um Digital CMOS," by Foley, David J.; Flynn, Michael P., IEEE Journal of Solid-State Circuits, Volume: 37, No. 3, pages 310 to 316, March 2002. One disadvantage of this approach is that the design is tailored for single-ended output applications and not differential applications.

Based on the foregoing, there remains a need for a driver circuit for generating a drive waveform that overcomes the disadvantages set forth previously.

SUMMARY OF THE INVENTION

According to one embodiment of the present invention, a driver circuits that generate a drive waveform with a static bit swing and a pre-emphasis bit swing are described. The driver circuit includes an input (IN) node, a complementary input (INB) node, an output (OUT) node and a complementary output (OUTB) node. The driver circuit includes a fundamental swing determination mechanism (FSDM) that is coupled to the output (OUT) node and a complementary output (OUTB) node. The fundamental swing determination mechanism (FSDM) determines or sets the fundamental swing of the drive waveform by generating a fundamental current. The fundamental swing determination mechanism (FSDM) includes at least one switched resistor circuit. The driver circuit also includes a modulation swing determination mechanism (MSDM) that is coupled to the output (OUT) node and a complementary output (OUTB) node. The modulation swing determination mechanism (MSDM) determines or sets the modulation swing of the drive waveform by generating a modulation current. The modulation swing determination mechanism (MSDM) includes at least one switched current source. The pre-emphasis bit swing of the drive waveform is generated when the modulation current is added to the fundamental current. The static bit swing is generated when the modulation current is subtracted from the fundamental current.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Driver circuits that generate a drive waveform with a fundamental swing and a modulation swing are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Module 100

Figure 1:
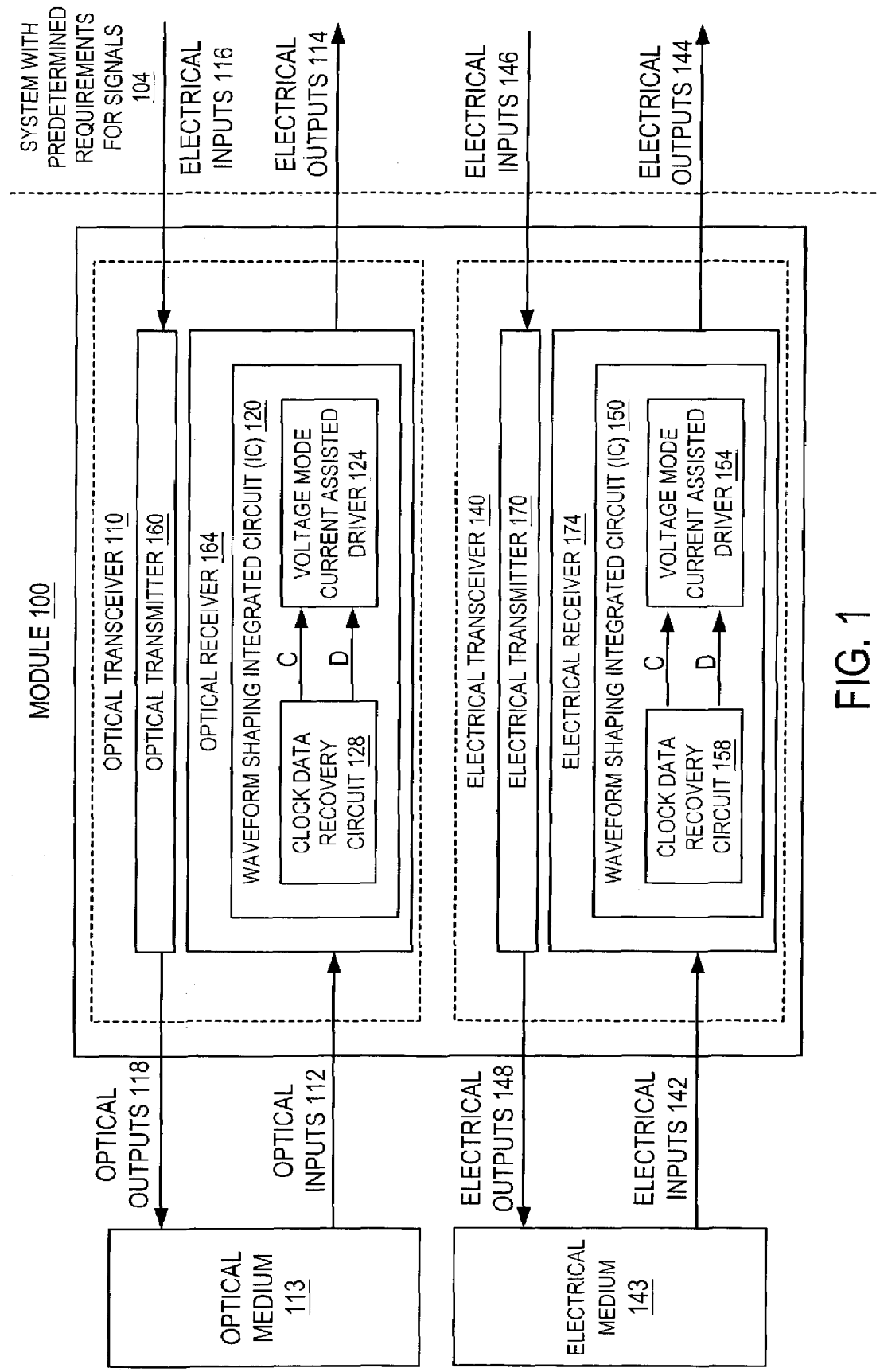
FIG. 1 illustrates a module in which the driver circuit according to the invention can be implemented.

FIG. 1 illustrates a module 100 in which the driver circuit according to the invention can be implemented. The module 100 is coupled to interact and communicate data with a system 104 that has predetermined signal requirements or specifications. For example, the system 104 can comply with the requirements set forth in InfiniBand Trade Association publishes InfiniBand™ Architecture Specification Release 1.1, Vol. 1 and Vol. 2 (released Nov. 6, 2002) (see http://www.infinibandta.org/specs/register/publicspec/). This specification sets forth various parameters and requirements for the electrical, optical, mechanical specifications for use by designers of products and components that are compliant with the InfiniBand™ Architecture.

Module 100

FIG. 1 illustrates a module 100 in which the driver circuit 124, 154 according to the invention can be implemented. The module 100 is coupled to interact and communicate data with a system 104 that has predetermined signal requirements or specifications. For example, the system 104 can comply with the requirements set forth in InfiniBand Trade Association publishes InfiniBand™ Architecture Specification Release 1.1, Vol. 1 and Vol. 2 (released Nov. 6, 2002) (see http://www.infinibandta.org/specs/register/public-spec/). This specification sets forth various parameters and requirements for the electrical, optical, mechanical specifications for use by designers of products and components that are compliant with the InfiniBand™ Architecture.

Optical Transceiver 110

The module 100 can include an optical transceiver 110 that has 1) optical inputs 112 for receiving an optical signal from an optical medium 113 (e.g., a fiber optic cable), 2) electrical outputs 114 for providing an electrical signal (e.g., an electrical corresponding to the optical signal received at inputs 112), 3) electrical inputs 116 for receiving an electrical signal from the system 104, and 4) optical outputs 118 for providing an optical signal (e.g., an optical signal corresponding to the electrical signal received at inputs 116) to the optical medium 113.

The optical transceiver 110 includes an optical transmitter 160 and an optical receiver 164. The optical transmitter 160 includes electrical inputs 116 for receiving an electrical signal from the system 104. The optical transmitter 160 converts the received electrical signal into a corresponding optical signal and provides the optical signal at optical outputs 118 to the optical medium 113. The optical receiver 164 includes optical inputs 112 for receiving an optical signal from the optical medium 113. The optical receiver 164 converts the received optical signal into a corresponding electrical signal in a format suitable for system 104 and provides the electrical signal at electrical outputs 114 to the system 104.

Typically, the optical signal is converted into an electrical signal by a photo detector. The resulting electrical signal is then conditioned and processed into a format acceptable to system 104 by a circuit, such as a waveform shaping integrated circuit described herein below.

The optical receiver 164 includes a waveform shaping integrated circuit (IC) 120 for performing processing on the received signal to condition and shape the signal so that the signal conforms to the specifications required by system 104. The waveform shaping IC 120 includes a driver circuit 124 (e.g., a voltage mode current-assisted pre-emphasis driver (VMCAPED)) according to the invention and a clock data recovery circuit 128 for providing a data signal (C), its complement (CB), a delay by one bit data signal (D), its complement (DB), and a clock signal (CLK).

The waveform shaping IC 120 can also include other circuits, such as receiver circuit, voltage controlled oscillator (VCO), etc., whose construction and operation are known by those of ordinary skill in the art.

Electrical Transceiver 140

The module 100 can include an electrical transceiver 140 that has 1) electrical inputs 142 for receiving an electrical signal from an electrical medium 143 (e.g., a conductive wire or cable), 2) electrical outputs 144 for providing an electrical signal (e.g., an electrical signal corresponding to the signal received at inputs 142) to the system 104, 3) electrical inputs 146 for receiving an electrical signal from the system 104, and 4) electrical outputs 148 for providing an electrical signal (e.g., an electrical signal corresponding to the signal received at inputs 146) to the electrical medium 143.

The electrical transceiver 140 includes an electrical transmitter 170 and an electrical receiver 174. The electrical transmitter 170 includes electrical inputs 146 for receiving an electrical signal from the system 104. The electrical transmitter 170 converts the received electrical signal into a format suitable for another system (not shown) and provides the converted electrical signal at electrical outputs 148 to the electrical medium 143. The electrical receiver 174 includes electrical inputs 142 for receiving an electrical signal from the electrical medium 143. The electrical receiver 174 converts the received electrical signal into a format suitable for the system 104 and provides the converted electrical signal at electrical outputs 144 to the system 104.

The electrical receiver 174 includes a waveform shaping integrated circuit (IC) 150 for performing processing on the received signal to condition and shape the signal so that the signal conforms to the specifications required by system 104. For example, the electrical signal is conditioned and processed into a format acceptable to system 104.

The waveform shaping IC 150 includes a driver circuit 154 (e.g., a voltage mode current-assisted pre-emphasis driver (VMCAPED)) according to the invention and a clock data recovery circuit 158 for providing a data signal (C), its complement (CB), a delay by one bit data signal (D), its-complement (DB), and a clock signal (CLK).

It is noted that the module 100 can be a purely optical module in which the electrical transceiver 140 is absent. In this case, module 100 can be an optical receiver, an optical transmitter, or an optical transceiver 10 as shown. Similarly, it is noted that the module 100 can be a purely electrical module in which the optical transceiver 110 is absent. In this case, the module 100 can be an electrical receiver, an electrical transmitter, or an electrical transceiver 140 as shown. For example, the driver according to the invention can be implemented in an optical receiver, an electrical receiver, the optical receiver portion of an optical transceiver, or the electrical receiver portion of an electrical transceiver.

Driver 124, 154

Figure 2:
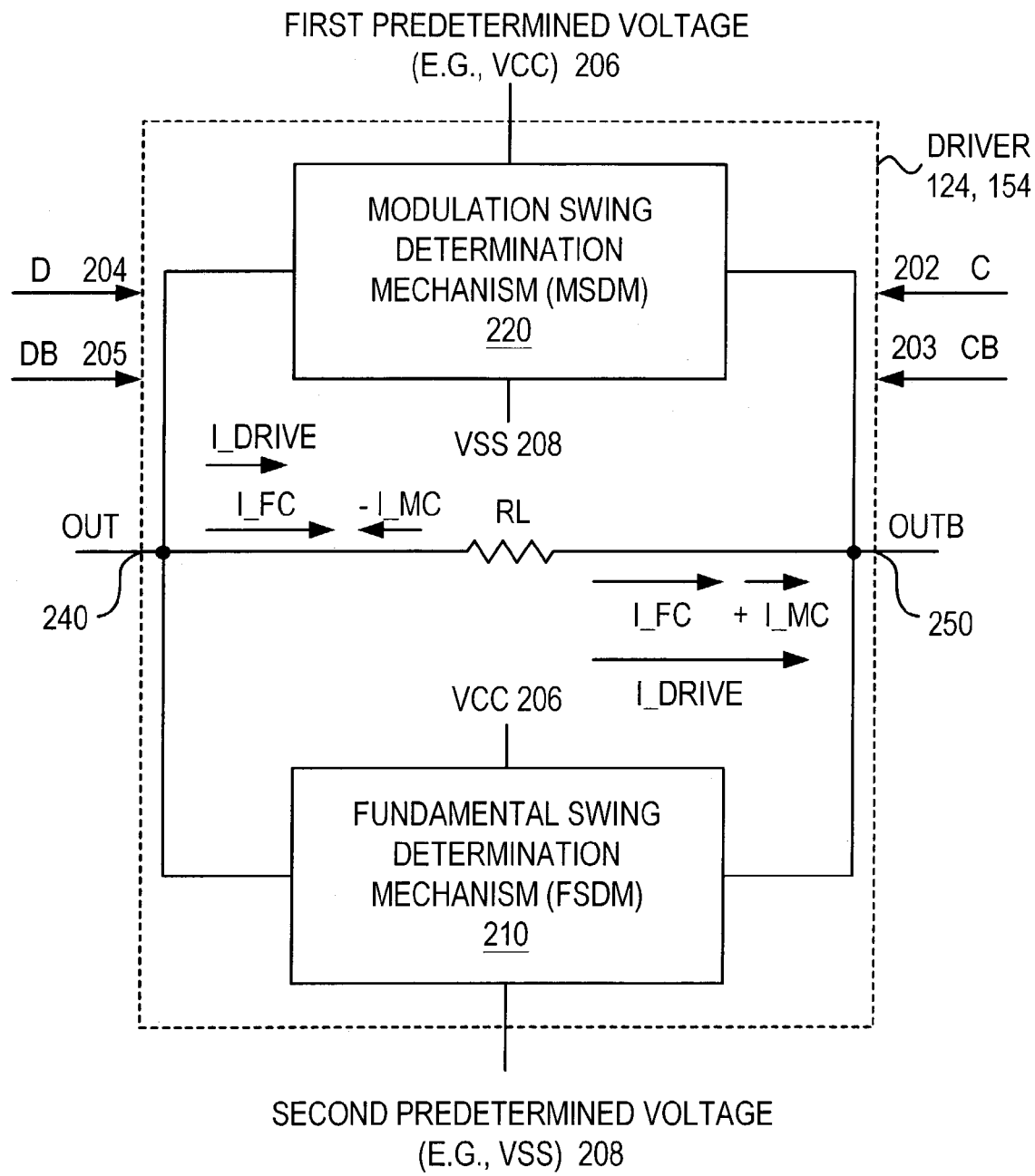
FIG. 2 illustrates in greater detail the driver of FIG. 1 according to one embodiment of the invention.

FIG. 2 illustrates in greater detail the driver 124, 154 of FIG. 1 according to one embodiment of the invention. The driver 124, 154 includes a first input 202 for receiving a data signal (C), and a second input 203 for receiving a complement of the data signal (CB), third input 204 for receiving a delay-by-one-bit data signal (D), and a fourth input 205 for receiving a complement of the delay-by-one-bit data signal (DB), a fifth input for receiving a first predetermined voltage (e.g., $V_{CC}$), and a sixth input for receiving a second predetermined voltage (e.g., $V_{SS}$).

The driver 124, 154 also includes a first output 240 for coupling to the output (OUT) node and a second output 250 for coupling to the complementary output (OUTB) node. The driver 124, 154 generates a drive waveform at the first output 240 and second output 250. As described previously, the first output 240 and the second output 250 can be coupled to drive a load (e.g., $R_L$) that may be the electronics in a next stage.

Figure 11:
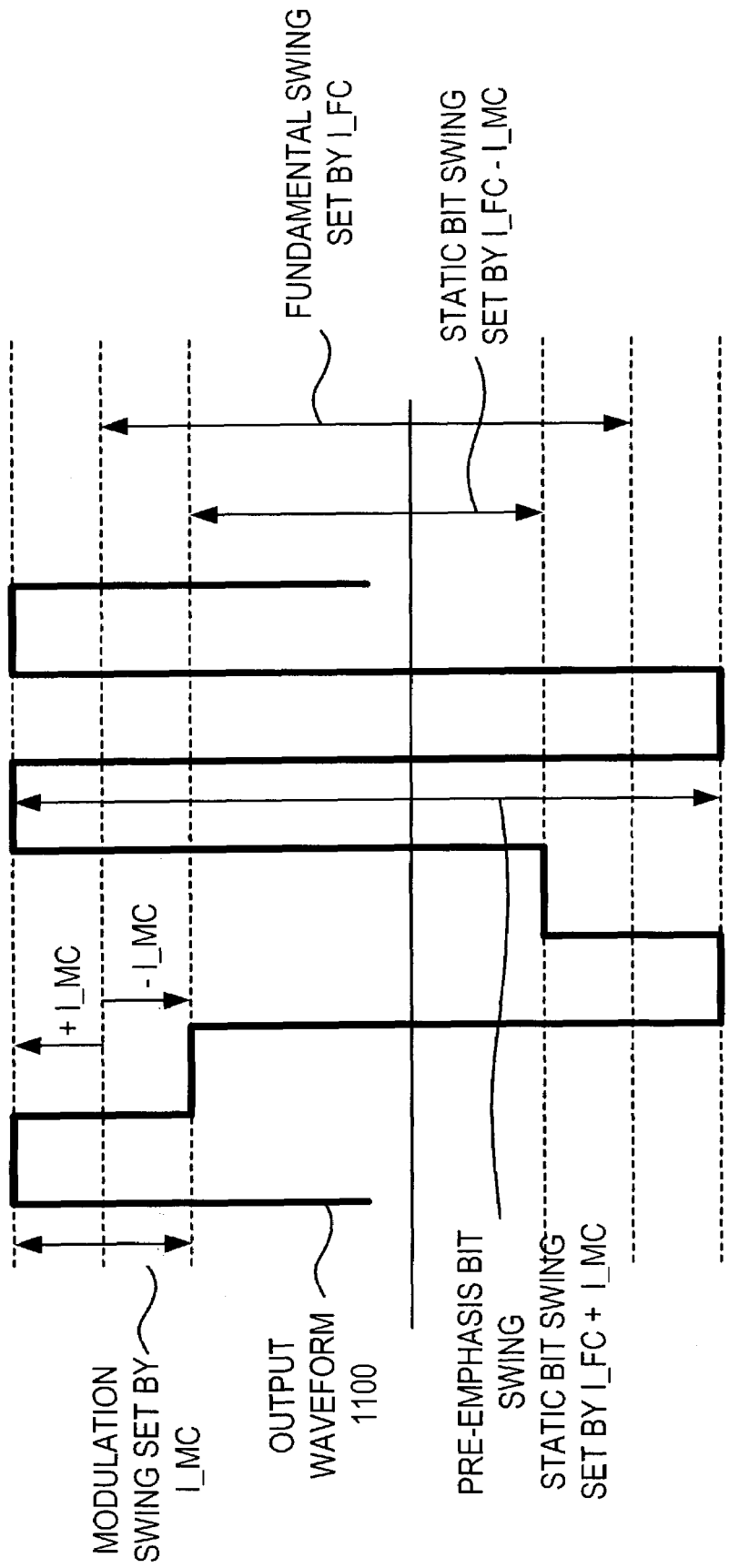
FIG. 11 illustrates an exemplary drive waveform generated by the driver according to one embodiment of the invention.

An exemplary drive waveform 1100 is illustrated in FIG. 11. The drive waveform 1100 includes a static bit swing and a pre-emphasis bit swing. The drive waveform 1100 also includes a fundamental swing and a modulation swing that are described in greater detail hereinafter.

The data signal, "delay-by-1-bit" data signal, and a clock signal, with their respective complement signals may be provided by a data and clock recovery circuit, whose construction and operation are known to those of ordinary skill in the art.

The driver 124, 154 includes a fundamental swing determination mechanism (FSDM) 210 for determining the fundamental swing of the drive waveform and a modulation swing determination mechanism (MSDM) 220 for determining the modulation swing of the drive waveform.

In one embodiment, the fundamental swing determination mechanism (FSDM) 210 includes a first input 202 for receiving a data signal (C), and a second input 203 for receiving a complement of the data signal (CB), third input 204 for receiving a delay-by-one-bit data signal (D), and a fourth input 205 for receiving a complement of the delay-by-one-bit data signal (DB), a fifth input for receiving a first predetermined voltage (e.g., $V_{CC}$), and a sixth input for receiving a second predetermined voltage (e.g., $V_{SS}$).

The fundamental swing determination mechanism (FSDM) 210 also includes a first output for coupling to the output (OUT) node and a second output for coupling to the complementary output (OUTB) node. As described previously, the first output node and the second output node can be coupled to drive a load (e.g., $R_L$) that may be the electronics in a next stage. The fundamental swing determination mechanism (FSDM) determines a fundamental swing of the drive waveform by generating a fundamental current (I_FC) through the load (e.g., $R_L$).

The fundamental swing determination mechanism (FSDM) can include one or more fixed resistors, one or more switched resistors, or a combination thereof. Different examples of the fundamental swing determination mechanism (FSDM) are described in greater detail hereinafter with reference to FIGS. 3–5.

The modulation swing determination mechanism (MSDM) 220 includes a first input for receiving a data signal, a second input for receiving a delayed data signal, a third input for receiving a first predetermined voltage (e.g., $V_{CC}$), a fourth input for receiving a second predetermined voltage (e.g., $V_{SS}$). The modulation swing determination mechanism (MSDM) 220 also includes a first output for coupling to the OUT node and a second output for coupling to the OUTB node. As described previously, the first output node and the second output node can be coupled to drive a load (e.g., $R_L$) that may be the electronics in a next stage.

The modulation swing determination mechanism (MSDM) 220 determines the modulation swing (shown on FIG. 11) of the drive waveform by generating a modulation current (I_MC) through the load (e.g., $R_L$). The modulation swing determination mechanism (MSDM) 220 can include one or more fixed current sources, one or more switched current sources, or a combination thereof. Different examples of the modulation swing determination mechanism (MSDM) 220 are described in greater detail hereinafter with reference to FIGS. 6–9.

The modulation swing determination mechanism (MSDM) 220 injects current "I" on one output node (OUT) and draws current "I" on the complementary node (OUTB). When the net current (I_MC) provided by the MSDM 220 adds to the fundamental current (I_FC), the fundamental swing increases. In this case, the original limitation on the maximum voltage swing, which is set by the FSDM 210, is relaxed or lifted. Consequently, the differential voltage swing (e.g., the pre-emphasis bit swing) may exceed the power supply voltage magnitude Vcc (that is, the single-ended voltage swing may exceed Vcc). This relaxation of the voltage swing limitation is caused by 1) the increased current flow through the load (RL) and 2) the reduced current flow through the resistors (e.g., switched resistors or fixed resistors) that are coupled to the power supply voltage (Vcc).

When the net current (I_MC) provided by the MSDM 220 (e.g., current "I" injected into the output node (OUT) and current "I" drawn from the complementary node (OUTB)), subtracts from the fundamental current (I_FC), the fundamental voltage swing is reduced.

The time domain combination (e.g., constructive or subtractive) of the fundamental current (I_FC) and the modulation current (I_MC) creates waveform shaping. Specifically, the static bit swing (as shown in FIG. 11) of the drive waveform is generated when the modulation current (I_MC) is subtracted from the fundamental current (I_FC). The pre-emphasis bit swing (as shown in FIG. 11) of the drive waveform is generated when the modulation current (I_MC) is added to the fundamental current (I_FC). In other words, the pre-emphasis bit swing is determined by the summation of the fundamental voltage swing and the modulation voltage swing. Similarly, the static bit swing is determined by the subtraction of the modulation voltage swing from the fundamental voltage swing.

Fundamental Swing Determination Mechanism (F SDM) 210

Figure 3:
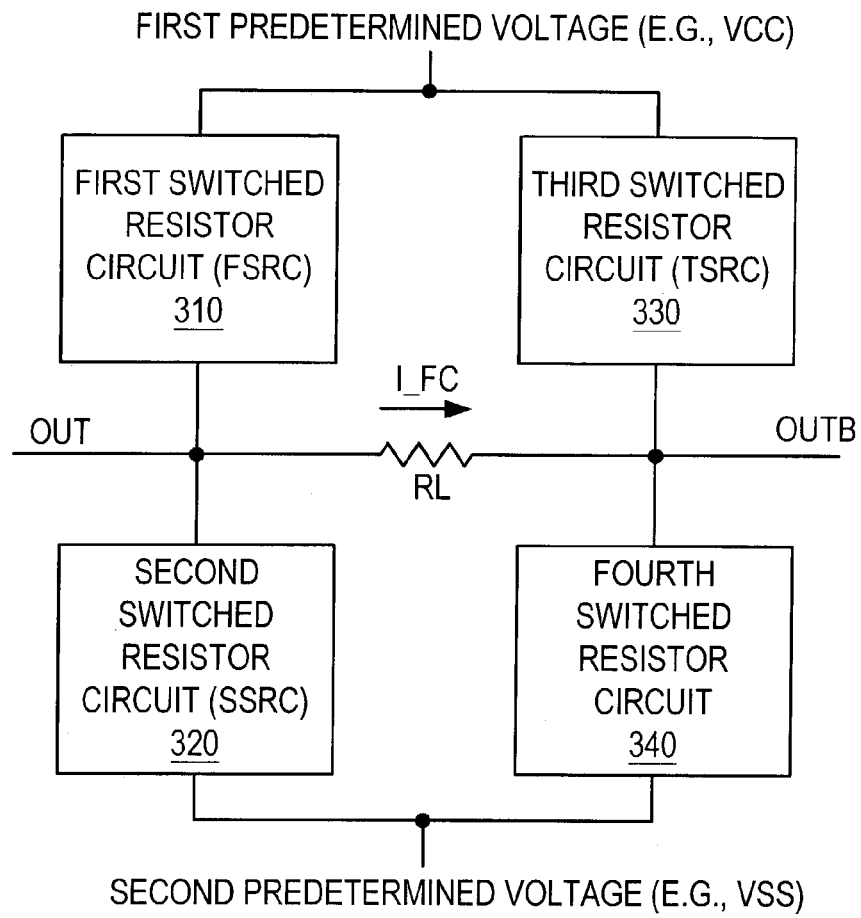
FIG. 3 illustrates in greater detail the fundamental swing determination mechanism (FSDM) of FIG. 2 according to one embodiment of the invention.

FIG. 3 illustrates in greater detail the fundamental swing determination mechanism (FSDM) 210 of FIG. 2 according to one embodiment of the invention. The fundamental swing determination mechanism (FSDM) 210 includes a first switched resistor circuit (FSRC) 310, a second switched resistor circuit (SSRC) 320, a third switched resistor circuit (TSRC) 330, and a fourth switched resistor circuit 340. The first switched resistor circuit (FSRC) 310 includes a first electrode for coupling to the first predetermined voltage (e.g., $V_{CC}$) and a second electrode for coupling to the OUT node. The second switched resistor circuit (SSRC) 320 includes a first electrode for coupling to the OUT node and second electrode for coupling to the second predetermined voltage (e.g., $V_{SS}$). The third switched resistor circuit (TSRC) 330 includes a first electrode for coupling to the first predetermined voltage (e.g., $V_{CC}$) and a second electrode for coupling to the OUTB node. The fourth switched resistor circuit 340 includes a first electrode for coupling to the OUTB node and a second electrode for coupling to the second predetermined voltage (e.g., $V_{SS}$).

In one embodiment, each switched resistor circuit (e.g., 310 to 340) includes ten switched resistors in parallel. When eight of the switched resistors of the first switched resistor circuit 310 and eight of the switched resistors of the fourth switched resistor circuit 340 are turned ON, and when two of the switched resistors of the second switched resistor circuit 320 and two of the switched resistors of the third switched resistor circuit 330 are turned ON, one direction of the fundamental swing is determined. The other direction of the swing may be determined by reversing the above configuration (e.g., two of the switched resistors of the first switched resistor circuit 310 and two of the switched resistors of the fourth switched resistor circuit 340 are turned ON, and eight of the switched resistors of the second switched resistor circuit 320 and eight of the switched resistors of the third switched resistor circuit 330 are turned ON). Other combinations provide other swing amplitudes while maintaining a single-ended output impedance of the ten switched resistors in parallel. It is noted that the output impedance of the driver 124, 154 is primarily determined or dominated by the FSDM 210 since the switched current sources have a large impedance as compared to the impedance of the FSDM 210.

Switched Resistor Circuit 310, 320, 330, 340

Figure 4:
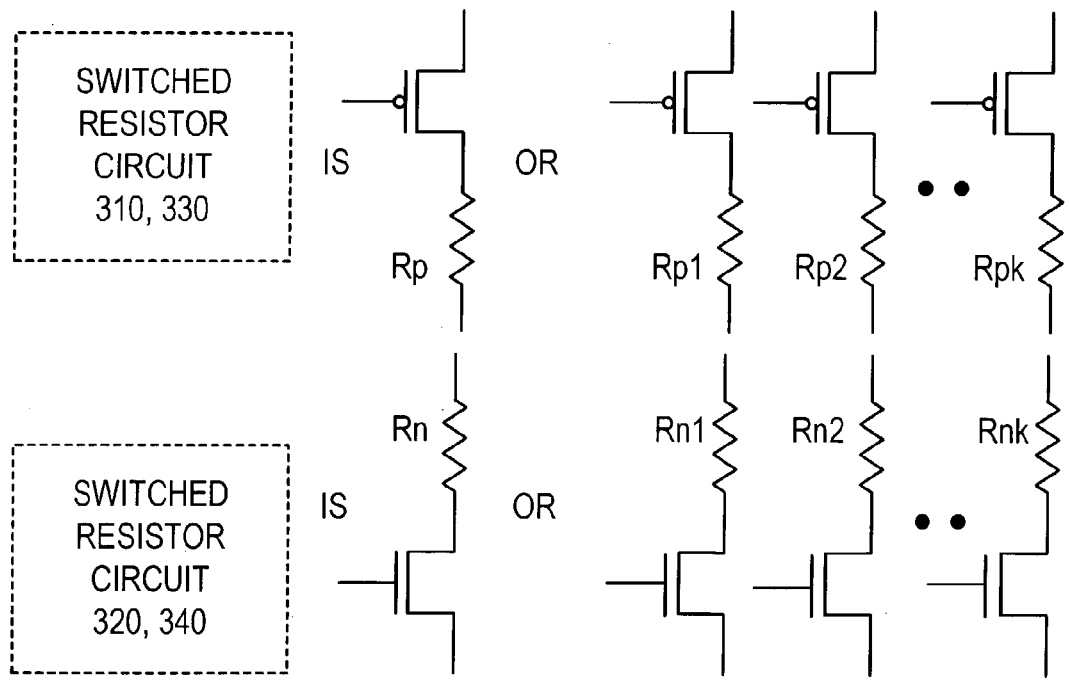
FIG. 4 illustrates an exemplary implementation of a switched resistor circuit of FIG. 3 according to one embodiment of the invention.

FIG. 4 illustrates an exemplary implementation of a switched resistor circuit 310, 320, 330, 340 of FIG. 3 according to one embodiment of the invention. In one embodiment, the switched resistor circuit can include a resistor R1 coupled in series with a switch (e.g., a field effect transistor (FET)) that is turned ON or OFF by a control signal (e.g., the data signal (c) or its complement (cb)).

In another embodiment, the switched resistor circuit can include a plurality of switched resistors in parallel. For example, each switched resistor circuit can include ten switched resistors in parallel with each transistor controlled by the same or different control signals. The control signals may be the data signal (c) and the complement of the data signal (cb) or some other control signal. In this manner, the resistance of the network can be modified or varied.

For example, the first switched resistor circuit 310 and third switched resistor circuit 330 can be implemented with a PMOS transistor in series with a resistor (e.g., Rp1, Rp2, . . . Rpk) or a plurality of PMOS transistors in series with a corresponding resistor arranged in parallel. Similarly, the second switched resistor circuit 320 and fourth switched resistor circuit 340 can be implemented with a NMOS transistor in series with a resistor (e.g., Rn1, Rn2, . . . Rnk) or a plurality of NMOS transistors in series with a corresponding resistor arranged in parallel.

A switched resistor can be any resistor or device, whose resistance or impedance is constant (e.g., fixed) or whose resistance or impedance can be controlled or varied by a control signal. In one embodiment, the switched resistors are implemented by metal-oxide semiconductor field effect transistor (MOSFET) triode resistors.

Exemplary Implementation Of Fundamental Swing Determination Mechanism

Figure 5:
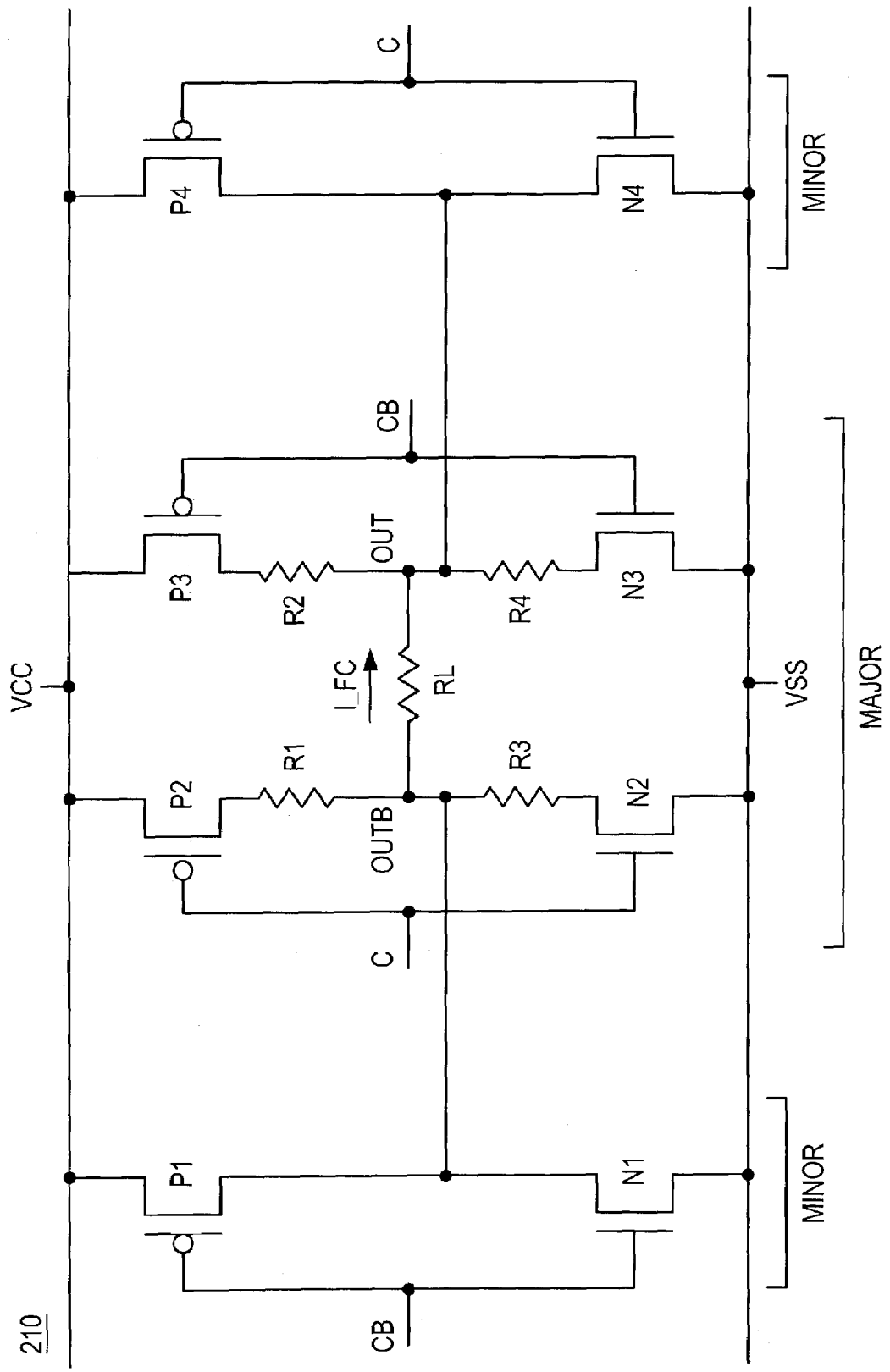
FIG. 5 illustrates an exemplary implementation of the fundamental swing determination mechanism (FSDM) of FIG. 3 according to one embodiment of the invention.

FIG. 5 illustrates an exemplary implementation of the fundamental swing determination mechanism (FSDM) 210 of FIG. 3 according to one embodiment of the invention. The fundamental swing determination mechanism (FSDM) 210 can be implemented with the circuit elements shown in FIG. 5. For example, the fundamental swing determination mechanism (FSDM) 210 can include P-MOS transistors P1, P2, P3, P4, N-MOS transistors N1, N2, N3, N4, and resistors R1, R2, R3, and R4.

It is noted that the MOS transistors in the fundamental swing determination circuit (FSDC) 210 serve as on/off switches with a finite "on resistance" and a large "off resistance." When a transistor is on, the resistance is the "on resistance" of the MOS operating in the triode region. When a transistor is off, the resistance is a large number since the MOS is in the cutoff region.

The driver according to the invention includes a single-ended output impedance that is primarily determined by the fundamental swing determination circuit (FSDC) 210. For example, when "c=high" and "cb=low", the single-ended output impedance (e.g., 50 ohm) of the driver at node "out" is determined or dominated by R2 plus the "on resistance" of transistor P3, in parallel with the "on resistance" of N4. It is noted that transistors N3 and P4 are now OFF.

The single-ended output impedance at node "outb" is determined or dominated by R3 plus the on resistance of N2, in parallel with the "on resistance" of transistor P1. It is noted that transistors N1 and P2 are now OFF.

For the case of "c=low" and "cb=high," the single-ended output impedance at node "outb" and node "out" can be determined in a manner similar to that described above. It is further noted that the impedances contributed by the fixed or switched current sources (e.g., the impedances of the current sources that are in parallel to the impedances of the switched resistor blocks) can be neglected since they are much larger than the output impedances contributed by the switched resistors blocks.

The driver according to the invention also includes an output voltage swing that is determined by both the fundamental swing determination mechanism (FSDM) 210 (e.g., a resistance network) and the modulation swing determination mechanism (MSDM) 220. For example, the modulation swing determination mechanism (MSDM) 220 injects current into or draws current from the fundamental swing determination mechanism (FSDM) 210.

When the "minor" circuits in FIG. 5 are not present, and the output impedance at OUT and OUTB is each equal to 50 ohms with a load impedance (RL) equal to 100 ohms, the maximum differential swing is $V_{CC}$ (the single-ended swing is equal to Vcc/2) with the common mode voltage (VCM) equal to Vcc/2.

Modulation Swing Determination Mechanism With Switched Current Sources

Figure 6:
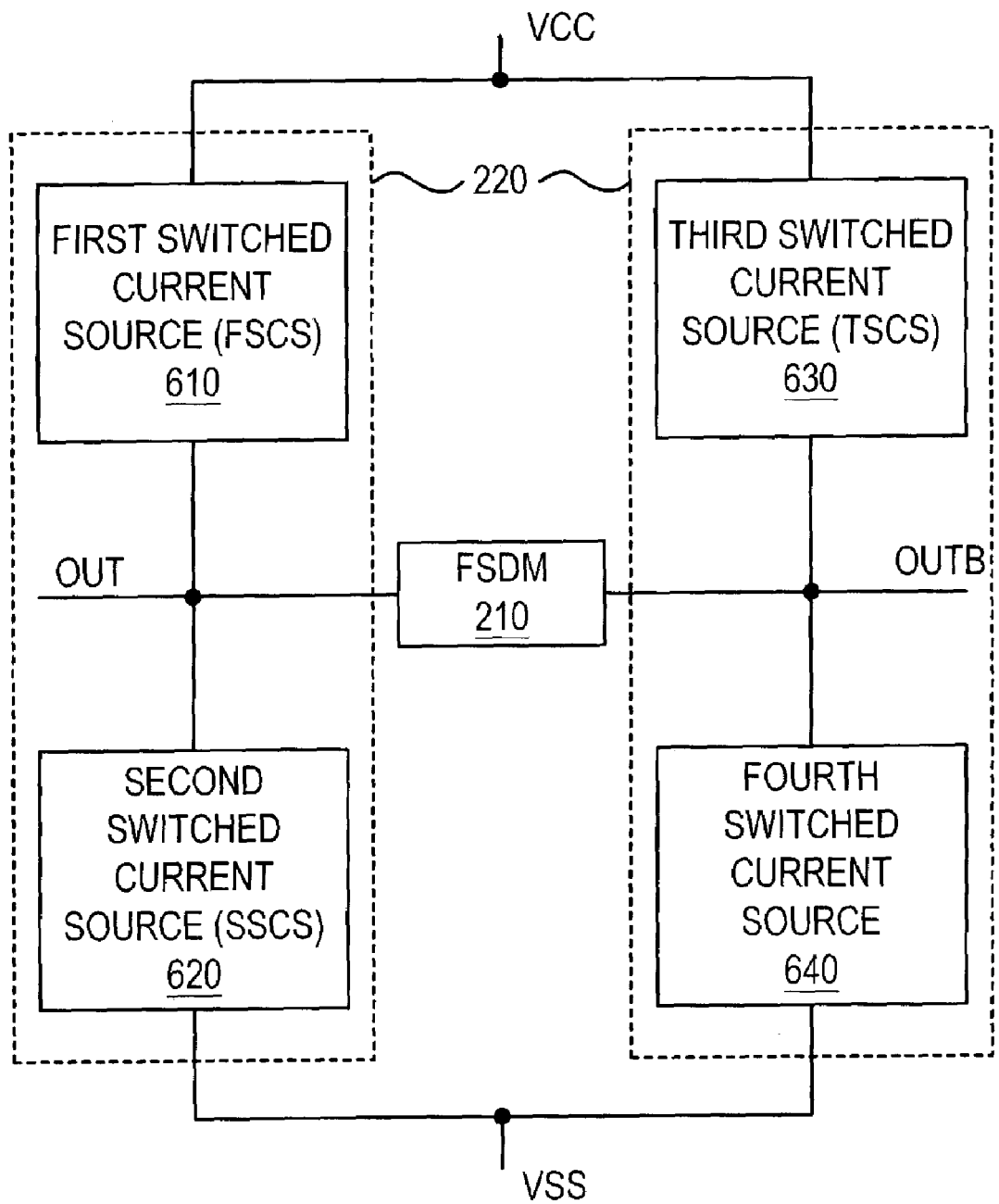
FIG. 6 illustrates a diagram of the modulation swing determination mechanism (MSDM) of FIG. 2 according to one embodiment of the invention.

FIG. 6 illustrates a diagram of the modulation swing determination mechanism (MSDM) 220 of FIG. 2 according to one embodiment of the invention. The modulation swing determination mechanism (MSDM) 220 includes a first switched current source (FSCS) 610, a second switched current source (SSCS) 620, a third switched current source (TSCS) 630, and a fourth switched current source 640. The first switched current source (FSCS) 610 includes a first electrode for coupling to the first predetermined voltage (e.g., $V_{CC}$) and a second electrode for coupling to the OUT node. The second switched current source (SSCS) 620 includes a first electrode for coupling to the OUT node and second electrode for coupling to the second predetermined voltage (e.g., $V_{SS}$).

The third switched current source (TSCS) 630 includes a first electrode for coupling to the first predetermined voltage (e.g., $V_{CC}$) and a second electrode for coupling to the OUTB node. The fourth switched current source 640 includes a first electrode for coupling to the OUTB node and a second electrode for coupling to the second predetermined voltage (e.g., $V_{SS}$).

The switched current sources (610, 620, 630, 640) can be implemented with metal-oxide semiconductor field effect transistor (MOSFET) saturation current sources.

Each of the switched current sources generates a respective current I(j), where j represents the number of the switched current source (e.g., first, second, third, fourth). The contribution of the respective currents I(j) on load RL is the modulation current (I_MC). The modulation current (I_MC) may be added or subtracted from the fundamental current generated by the FSDM 210 to determine the pre-emphasis bit swing and static bit swing, respectively.

The current injected into the OUT node and drawn from the OUTB node by the MSDM 220 increases the voltage swing to form the pre-emphasis bit swing. This increase is caused by an increased current flowing through RL and at the same time a decreased current flowing through the resistor circuits (R(i), where i=1, 2, 3, 4) from Vcc to Vss. One advantage provided by the driver according to the invention is that the voltage swing can be greater than Vcc.

Figure 7:
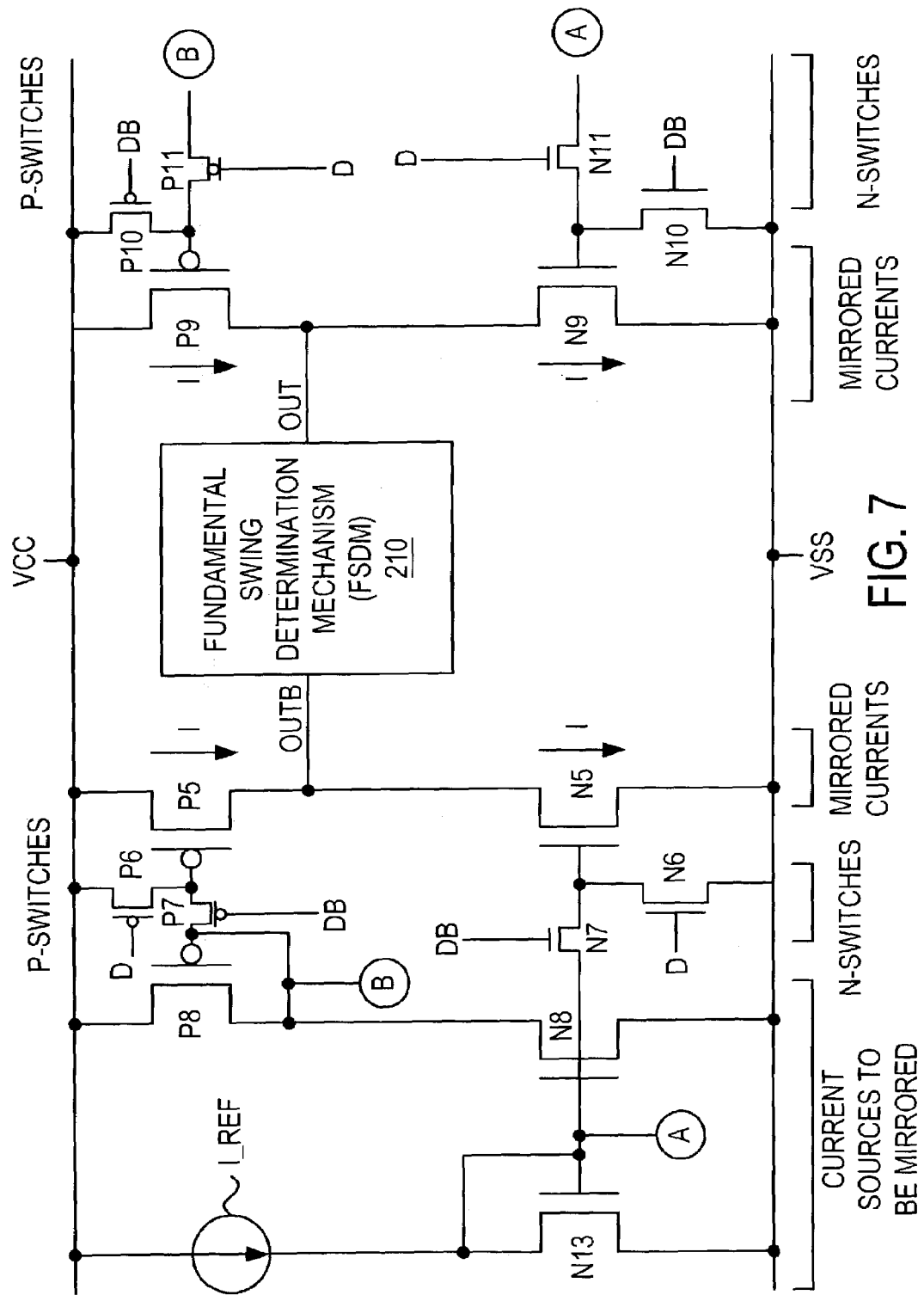
FIG. 7 illustrates in greater detail an exemplary implementation of the modulation swing determination mechanism (MSDM) of FIG. 6 according to one embodiment of the invention.

FIG. 7 illustrates in greater detail an exemplary implementation of the modulation swing determination mechanism (MSDM) of FIG. 6 according to one embodiment of the invention. The modulation swing determination mechanism (MSDM) 220 can be implemented with the circuit elements shown in FIG. 7. For example, the modulation swing determination mechanism (MSDM) 220 can include P-MOS transistors P5, P6, P7, P8, P9 P10 and P11, N-MOS transistors N5, N6, N7, N8, N9, N10, N11 and N13.

It is noted that the current flowing through transistor N3 is the same current as the reference current (I_REF). The current flowing through transistor N8 mirrors the reference current (I_REF) from transistor N13. The current flowing through transistor P8 is the same as the current flowing through transistor N8. Similarly, transistors P5 and P9 mirror the current flowing through transistor P8 via the gate voltage denoted by "B". These transistors are employed as current mirroring circuits.

Modulation Swing Determination Mechanism With a Fixed Current Source

Figure 8:
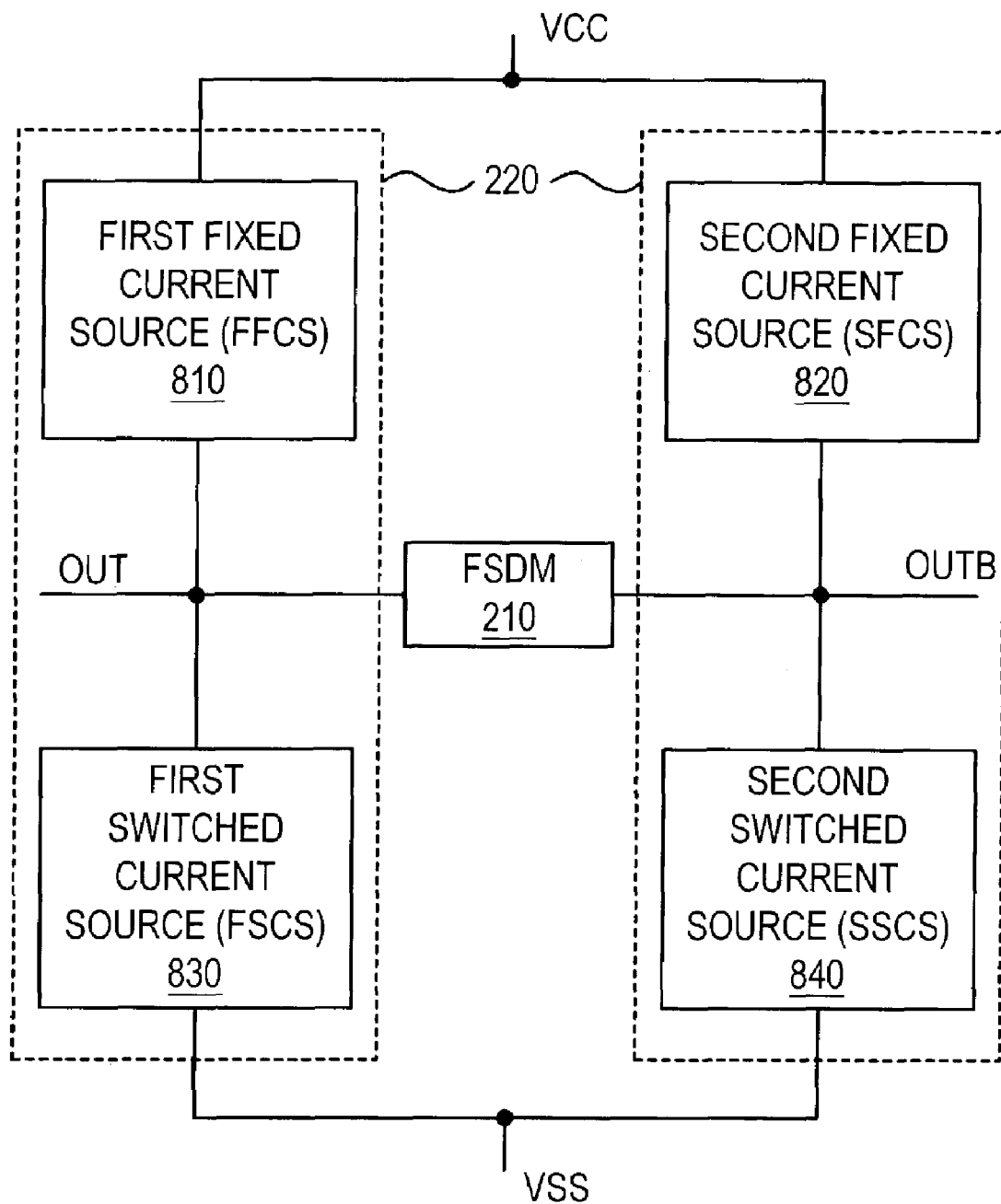
FIG. 8 illustrates a diagram of the modulation swing determination mechanism (MSDM) of FIG. 2 according to an alternative embodiment of the invention.

FIG. 8 illustrates a diagram of the modulation swing determination mechanism (MSDM) of FIG. 2 according to an alternative embodiment of the invention. For certain applications, the slow switching speed of the P-MOS current sources of the modulation swing determination mechanism (MSDM) embodiment illustrated in FIG. 7 is problematic. This problem may be solved by the modulation swing determination mechanism (MSDM) configured according to an alternative embodiment of the invention that employs a fixed current source "I" on the P-side, and using a switched current source "2I" on the N-side.

The modulation swing determination mechanism (MSDM) 220 includes a first fixed current source (FFCS) 810, a first fixed current source (SFCS) 820, a first switched current source (FSCS) 830, and a second switched current source (SSCS) 840. The first fixed current source (FFCS) 810 includes a first electrode for coupling to the first predetermined voltage (e.g., $V_{CC}$) and a second electrode for coupling to the OUT node. The second fixed current source (SFCS) 820 includes a first electrode for coupling to the first predetermined voltage (e.g., $V_{CC}$) and second electrode for coupling to the OUTB node.

The first switched current source (FSCS) 830 includes a first electrode for coupling to the OUT node and a second electrode for coupling to the second predetermined voltage (e.g., $V_{SS}$). The second switched current source (SSCS) 840 includes a first electrode for coupling to the OUTB node and a second electrode for coupling to the second predetermined voltage (e.g., $V_{SS}$).

The fixed current sources (810, 820) can be implemented with P-type channel metal-oxide semiconductor field effect transistor (MOSFET) saturation current sources. The switched current sources (830, 840) can be implemented with N-type channel metal-oxide semiconductor field effect transistor (MOSFET) saturation current sources.

Figure 9:
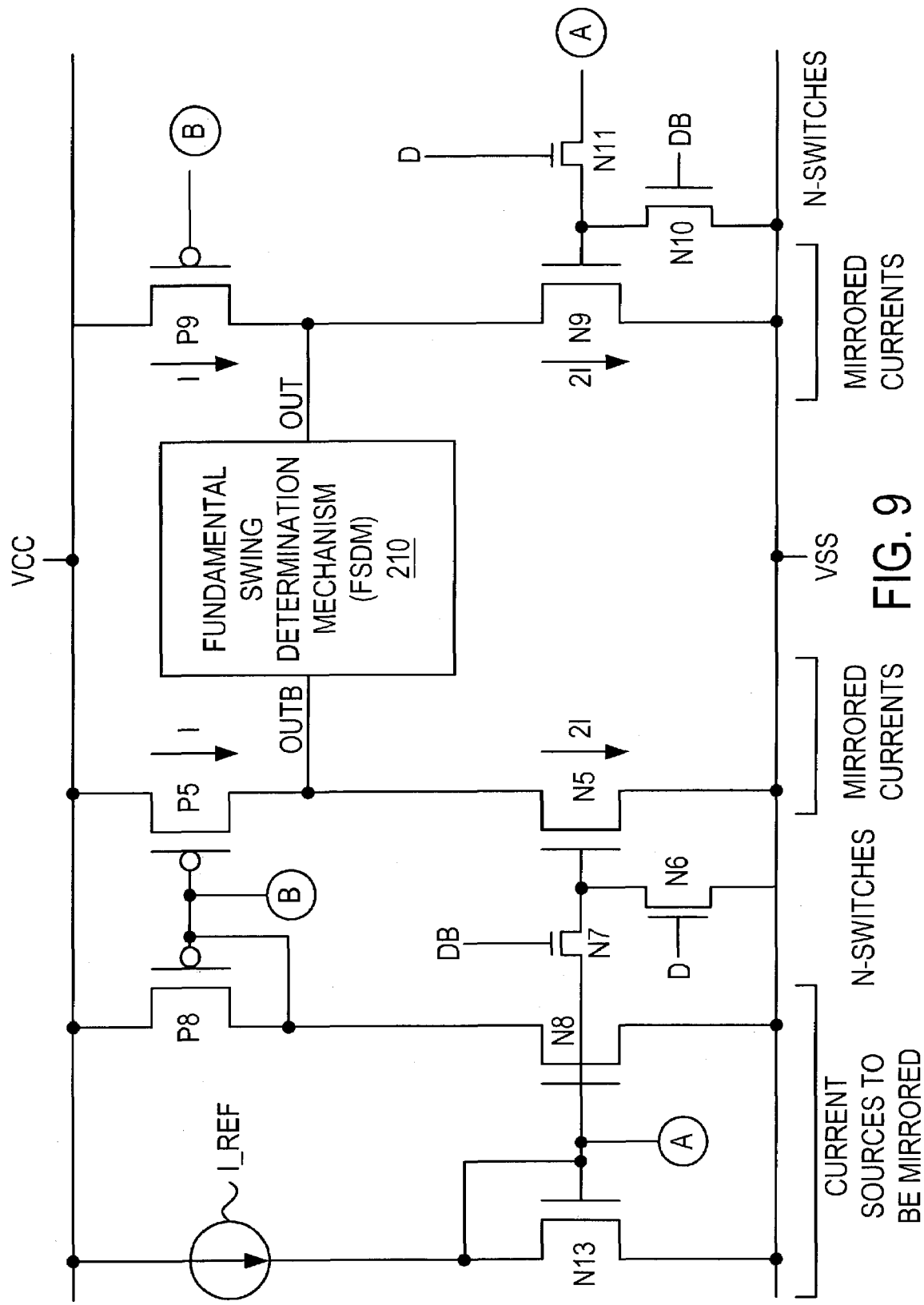
FIG. 9 illustrates in greater detail an exemplary implementation of the modulation swing determination mechanism (MSDM) of FIG. 8 according to one embodiment of the invention.

FIG. 9 illustrates in greater detail an exemplary implementation of the modulation swing determination mechanism (MSDM) of FIG. 8 according to one embodiment of the invention. The modulation swing determination mechanism (MSDM) 220 can be implemented with the circuit elements shown in FIG. 9. For example, the modulation swing determination mechanism (MSDM) 220 can include P-MOS transistors P5, P8 and P9, N-MOS transistors N5, N6, N7, N8, N9, N10, N11 and N13.

Processing Steps

Figure 10:
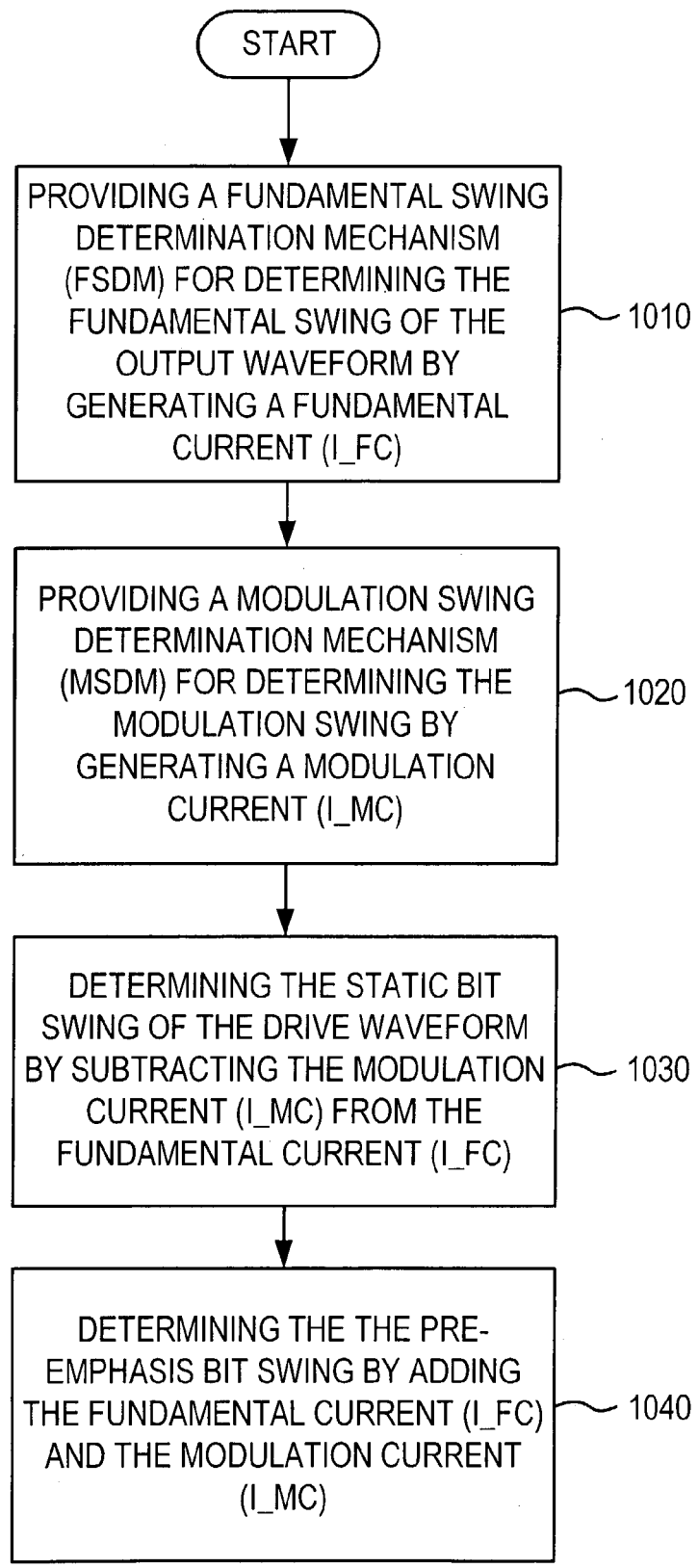
FIG. 10 is a flow chart illustrating the operation of the driver according to one embodiment of the invention.

FIG. 10 is a flow chart illustrating the operation of the driver according to one embodiment of the invention. In step 1010, a fundamental swing determination mechanism (FSDM) for determining the fundamental swing of the output waveform by generating a fundamental current (I_FC) is provided. In step 1020, a modulation swing determination mechanism (MSDM) for determining the modulation swing by generating a modulation current (I_MC) is provided. In step 1030, the static bit swing is determined by subtracting the modulation current (I_MC) from the fundamental current (I_FC). In step 1040, the pre-emphasis bit swing is determined by adding the fundamental current (I_FC) and the modulation current (I_MC).

FIG. 11 illustrates an exemplary drive waveform generated by the driver according to one embodiment of the invention. The waveform is a differential signal. It is noted that the single-ended common mode is equal to Vcc/2, and the single-ended swing is equal to Vdiff/2.

Although the driver circuits, fundamental swing determination mechanisms, and modulation swing determination mechanisms, according to the invention have been described by the various embodiments shown in FIGS. 1–9, other arrangements can be devised in accordance with the teachings of the invention to realize other driver circuits, fundamental swing determination mechanisms, and modulation swing determination mechanisms, that generate drive waveforms with a static bit swing and a pre-emphasis bit swing greater than the predetermined voltage supply (Vcc).

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A circuit for generating a drive waveform is used for driving a load; wherein the drive waveform includes a static bit swing and a pre-emphasis bit swing, the circuit comprising:
   a) an input (IN) node;
   b) a complementary input (INB) node;
   c) an output (OUT) node;
   d) a complementary output (OUTB) node;
   e) a fundamental swing determination mechanism (FSDM) coupled to the output (OUT) node and the complementary output (OUTB) node for determining a fundamental swing of the drive waveform by generating a fundamental current (I_FC) through the load; and
   f) a modulation swing determination mechanism (MSDM) coupled to the output (OUT) node and the complementary output (OUTB) node for determining a modulation swing of the drive waveform by generating a modulation current (I_MC) through the load;
   wherein the static bit swing is generated when the modulation current (I_MC) is subtracted from the fundamental current (I_FC); and
   wherein the pre-emphasis bit swing of the drive waveform is generated when the modulation current (I_MC) is added to the fundamental current (I_FC); wherein the circuit includes a voltage mode architecture.

2. The circuit of claim 1 wherein the fundamental swing determination mechanism (FSDM) includes
   a first switched resistor circuit with a modifiable resistance having a first node coupled to a first predetermined voltage and a second node coupled to the output (OUT) node;
   a second switched resistor circuit with a modifiable resistance having a first node coupled to the second node of the first switched resistor circuit and a second node coupled to a second predetermined voltage;

a third switched resistor circuit with a modifiable resistance having a first node coupled to the first predetermined voltage and a second node coupled to the complementary output (OUTB) node;

a fourth switched resistor circuit with a modifiable resistance having a first node coupled to the second node of the third switched resistor circuit and a second node coupled to the second predetermined voltage;

wherein when the first switched resistor circuit and the fourth switched resistor circuit are on, the second switched resistor circuit and third switched resistor circuit are off; and wherein when the second switched resistor circuit and third switched resistor circuit are off, the first switched resistor circuit and the fourth switched resistor circuit are on.

3. The circuit of claim 2
wherein each switched resistor circuit can include one of a transistor, at least two transistors in series, a transistor in series with one resistor; a transistor in series with at least two resistors, at least two transistors and a resistor in series, and at least two transistors and at least two resistors in series.

4. The circuit of claim 1
wherein the first predetermined voltage is a supply voltage (Vcc); and wherein the drive waveform signal includes a pre-emphasis bit swing that is greater than the supply voltage (Vcc).

5. The circuit of claim 1 wherein the circuit has an output impedance; and wherein the fundamental swing determination mechanism (FSDM) includes
a network of switched resistor circuits for primarily determining the output impedance of the circuit; wherein each switched resistor circuit includes an input for receiving a control signal; wherein the control signal is employed to selectively adjust the fundamental current (I_FC).

6. The circuit of claim 2 wherein the switched resistor circuits include metal-oxide semiconductor field effect transistor (MOSFET) triode resistors.

7. The circuit of claim 1 wherein the modulation swing determination mechanism (MSDM) includes
a network of switched current sources for generating a modulation current (I_MC).

8. The circuit of claim 7 wherein the network of switched current sources for generating a modulation current (I_MC) includes
a first switched current source for generating a first current when on, the first switched current source including a first node coupled to a first predetermined voltage and a second node coupled to the output (OUT) node;
a second switched current source for generating a second current when on, the second switched current source including a first node coupled to the second node of the first switched current source and a second node coupled to a second predetermined voltage;
a third switched current source for generating a third current when on, third switched current source including a first node coupled to the first predetermined voltage and a second node coupled to the complementary output (OUTB) node; and
a fourth switched current source for generating a fourth current when on, the fourth switched current source having a first node coupled to the second node of the third switched current source and a second node coupled to the second predetermined voltage;

wherein the first current, second current, third current and fourth current are utilized to generate the modulation current (I_MC).

9. The circuit of claim 8 wherein the first switched current source, the second switched current source, the third switched current source, and the fourth switched current source, are implemented with metal-oxide semiconductor field effect transistor (MOSFET) saturation current sources.

10. The circuit of claim 7 wherein the network of switched current sources for generating a modulation current (I_MC) includes
a first fixed current source for generating a first current, the first fixed current source including a first node coupled to a first predetermined voltage and a second node coupled to the output (OUT) node;
a second fixed current source for generating a second current, the second fixed current source including a first node coupled to the first predetermined voltage and a second node coupled to the complementary output (OUTB) node;
a first switched current source for generating a third current when on, the first switched current source including a first node coupled to the second node of the first fixed current source and a second node coupled to a second predetermined voltage; and
a second switched current source for generating a fourth current when on, the second switched current source having a first node coupled to the second node of the second fixed current source and a second node coupled to the second predetermined voltage;

wherein the first current, second current, third current and fourth current are utilized to generate the modulation current (I_MC).

11. The circuit of claim 10
wherein the first fixed current source and the second fixed current sources are implemented with P-type channel metal-oxide semiconductor field effect transistor (MOSFET) saturation current sources; and
wherein the first switched current source and the second switched current sources are implemented with N-type channel metal-oxide semiconductor field effect transistor (MOSFET) saturation current sources.

12. The circuit of claim 1 wherein the circuit is integrated in one of an electronic module and a fiber optic module.

13. The circuit of claim 12 wherein the electronic module includes one of an electronic transmitter, electronic receiver, and an electronic transceiver; and
wherein the fiber optic module includes one of a fiber optic transmitter, a fiber optic electronic receiver, and a fiber optic electronic transceiver.

14. A circuit for generating a drive waveform that is used for driving a load; wherein the drive waveform includes a static bit swing and a pre-emphasis bit swing, the circuit comprising:
g) an input (IN) node;
h) a complementary input (INB) node;
i) an output (OUT) node;
j) a complementary output (OUTB) node;
k) means coupled to the output (OUT) node and the complementary output (OUTB) node for determining a fundamental swing of the drive waveform by generating a fundamental current (I_FC) through the load; and
l) means coupled to the output (OUT) node and the complementary output (OUTB) node for determining a modulation swing of the drive waveform by generating a modulation current (I_MC) through the load;

wherein the static bit swing is generated when the modulation current (I_MC) is subtracted from the fundamental current (I_FC); and wherein the pre-emphasis bit swing of the drive waveform is generated when the modulation current (I_MC) is added to the fundamental current (I_FC): wherein the circuit includes a voltage mode architecture.

15. A method for generating a drive waveform that includes a static bit swing and a pre-emphasis bit swing, the method comprising the steps of:
  a) providing a fundamental swing determination mechanism (FSDM) for determining a fundamental swing of the output waveform;
  b) providing a modulation swing determination mechanism (MSDM) for determining a modulation swing of the output waveform; and
  c) employing the fundamental swing determination mechanism, (FSDM) and the modulation swing determination mechanism (MSDM) to determine the static bit swing and the pre-emphasis bit swing of the drive waveform; wherein the fundamental swing determination mechanism (FSDM) and modulation swing determination mechanism (MSDM) include a voltage mode architecture.

16. The method of claim 15 wherein the step of employing the fundamental swing determination mechanism (FSDM) and the modulation swing determination mechanism (MSDM) to determine the static bit swing and the pre-emphasis bit swing of the drive waveform includes
  c_1) employing the fundamental swing determination mechanism (FSDM) to generate a fundamental current (I_FC); and
  c_2) employing the modulation swing determination mechanism (MSDM) to generate a modulation current (I_MC).

17. The method of claim 16 wherein the step of employing the fundamental swing determination mechanism (FSDM) and the modulation swing determination mechanism (MSDM) to determine the static bit swing and the pre-emphasis bit swing of the drive waveform includes
  c_3) determining the static bit swing of the drive waveform by subtracting the modulation current (I_MC) from the fundamental current (I_FC); and
  c_4) determining the pre-emphasis bit swing of the drive waveform by adding the fundamental current (I_FC) and the modulation current (I_MC).

18. The method of claim 15 wherein the fundamental swing determination mechanism (FSDM) and the modulation swing determination mechanism (MSDM) are implemented in a driver that has an output impedance; wherein the step of providing a fundamental swing determination mechanism (FSDM) for determining a fundamental swing of the output waveform includes
  a_1) providing a network of switched resistor circuits that primarily determines the output impedance of the driver.

19. The method of claim 15 wherein the step of providing a modulation swing determination mechanism (MSDM) for determining a modulation swing of the output waveform includes
  b_1) providing at least one switched current source.

20. The method of claim 15 wherein the step of providing a modulation swing determination mechanism (MSDM) for determining a modulation swing of the output waveform includes b_1) providing at least one fixed current source.

* * * * *

UNITED STATES PATENT AND TRADEMARK OFFICE
CERTIFICATE OF CORRECTION

PATENT NO. : 7,109,759 B2
APPLICATION NO. : 10/445167
DATED : September 19, 2006
INVENTOR(S) : Pei-Der Tseng It is certified that error appears in the above-identified patent and that said Letters Patent is hereby corrected as shown below:

On the title page, item [73] (Assignee), Line 2, delete "Pte.Ltd.," and insert -- Pte. Ltd., --;

Item [56], (Other Publications), Line 3, delete "Eloectronics," and insert -- Electronics, --;

Column 13, Line 14, Claim 2, delete "arc off," and insert -- are off, --;

Column 15, Line 6, Claim 14, delete "(I_FC):" and insert -- (I_FC); --.

Signed and Sealed this

Second Day of November, 2010

David J. Kappos
*Director of the United States Patent and Trademark Office*